(12) United States Patent
Yen et al.

(10) Patent No.: US 9,280,046 B2
(45) Date of Patent: Mar. 8, 2016

(54) METHOD OF FABRICATING MASK

(71) Applicant: Taiwan Semiconductor Manufacturing Company, Ltd., Hsin-Chu (TW)

(72) Inventors: Anthony Yen, Hsinchu (TW);
Chih-Tsung Shih, Hsinchu (TW);
Ming-Jiun Yao, Hsinchu (TW);
Yen-Cheng Lu, New Taipei (TW);
Shinn-Sheng Yu, Hsinchu (TW);
Jeng-Horng Chen, Hsinchu (TW);
Hsin-Chang Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 186 days.

(21) Appl. No.: 14/052,060

(22) Filed: Oct. 11, 2013

(65) Prior Publication Data

US 2014/0272683 A1    Sep. 18, 2014

Related U.S. Application Data

(60) Provisional application No. 61/783,080, filed on Mar. 14, 2013.

(51) Int. Cl.
*G03F 1/76* (2012.01)
*G03F 7/004* (2006.01)

(52) U.S. Cl.
CPC ................ *G03F 1/76* (2013.01); *G03F 7/0043* (2013.01)

(58) Field of Classification Search
CPC .......................................................... G03F 1/76
USPC ............................................................. 430/5
See application file for complete search history.

*Primary Examiner* — Stephen Rosasco
(74) *Attorney, Agent, or Firm* — Haynes and Boone, LLP (57) ABSTRACT

A method for fabricating an extreme ultraviolet (EUV) mask includes providing a low thermal expansion material (LTEM) layer. A reflective multiple-layer (ML) is deposited over the LTEM layer. A flowable-photosensitive-absorption-layer (FPhAL) is spin coated over the reflective ML. The FPhAL is patterned by a lithography process to form a patterned absorption layer.

20 Claims, 10 Drawing Sheets

METHOD OF FABRICATING MASK

This patent claims the benefit of U.S. Ser. No. 61/783,080 filed Mar. 14, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, process induced stress becomes a more severe issue mask fabrication. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower,""above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
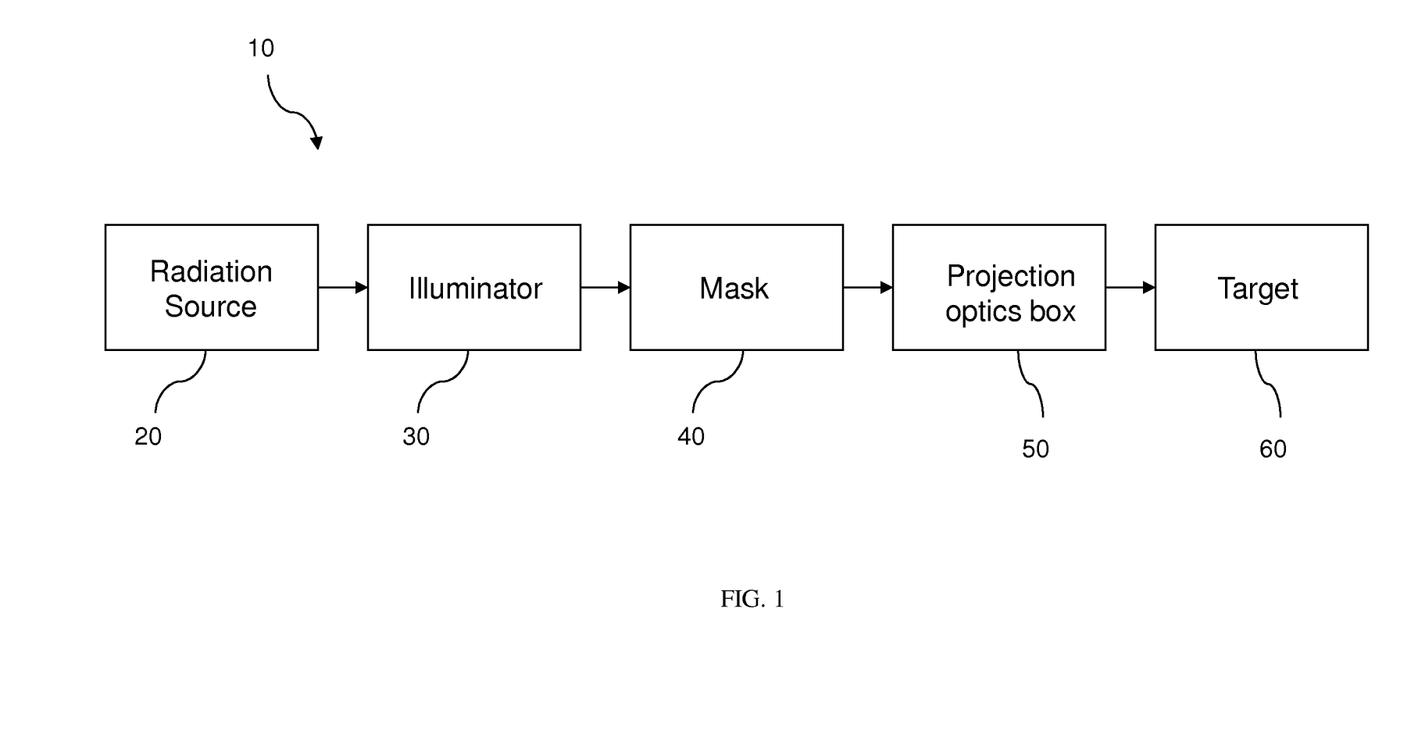
FIG. 1 is a block diagram of a lithography process for implementing one or more embodiments of the present invention.

Referring to FIG. 1, an EUV lithography process 10 that may benefit from one or more embodiments of the present disclosure is disclosed. The EUV lithography process 10 employs an EUV radiation source 20 having a wavelength of about 1-100 nm, including an EUV wavelength of about 13.5 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask. In the EUV wavelength range, reflective optics is employed generally.

The EUV lithography process 10 also employs a mask 40 (in the present disclosure, the terms mask, photomask, and reticle are used to refer to the same item). The mask 40 can be a transmissive mask or a reflective mask. The mask 40 contains patterns used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

The EUV lithography process 10 also employs a projection optics box (POB) 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation). The POB 50 directs the collected radiation to expose a target 60.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a mask substrate fabrication process and a mask patterning process. During the mask substrate fabrication process, a mask substrate is formed by depositing suitable layers (e.g., multiple reflective layers) on a suitable substrate. The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

The following description will be directed to a flowable-photosensitive-absorption-layer (FPhAL) mask, it being understood that various types of masks and various processes can benefit from the present invention.

Figure 2:
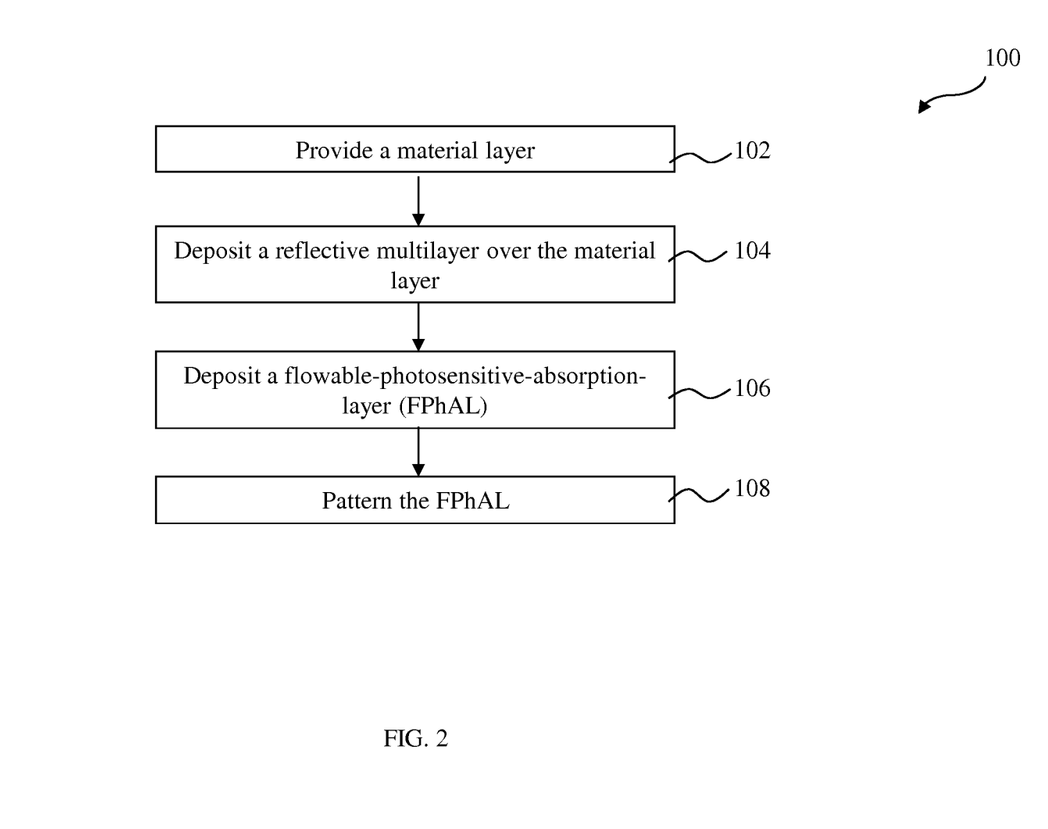
FIG. 2 is a flow chart of a method for fabricating a mask according to various aspects of the present disclosure.
Figure 3:
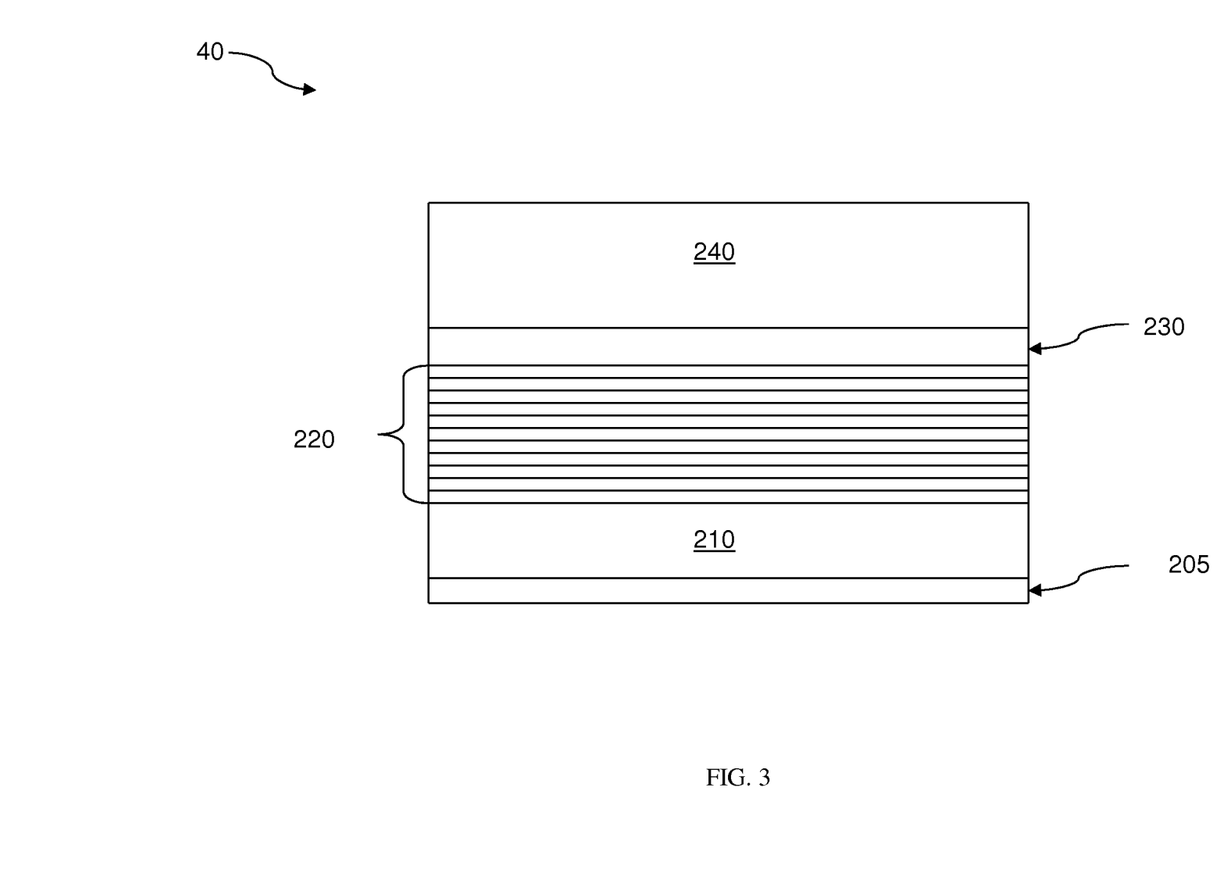
FIGS. 3 and 4 are diagrammatic cross-sectional views of a mask according to various aspects of the present disclosure.
Figure 4:
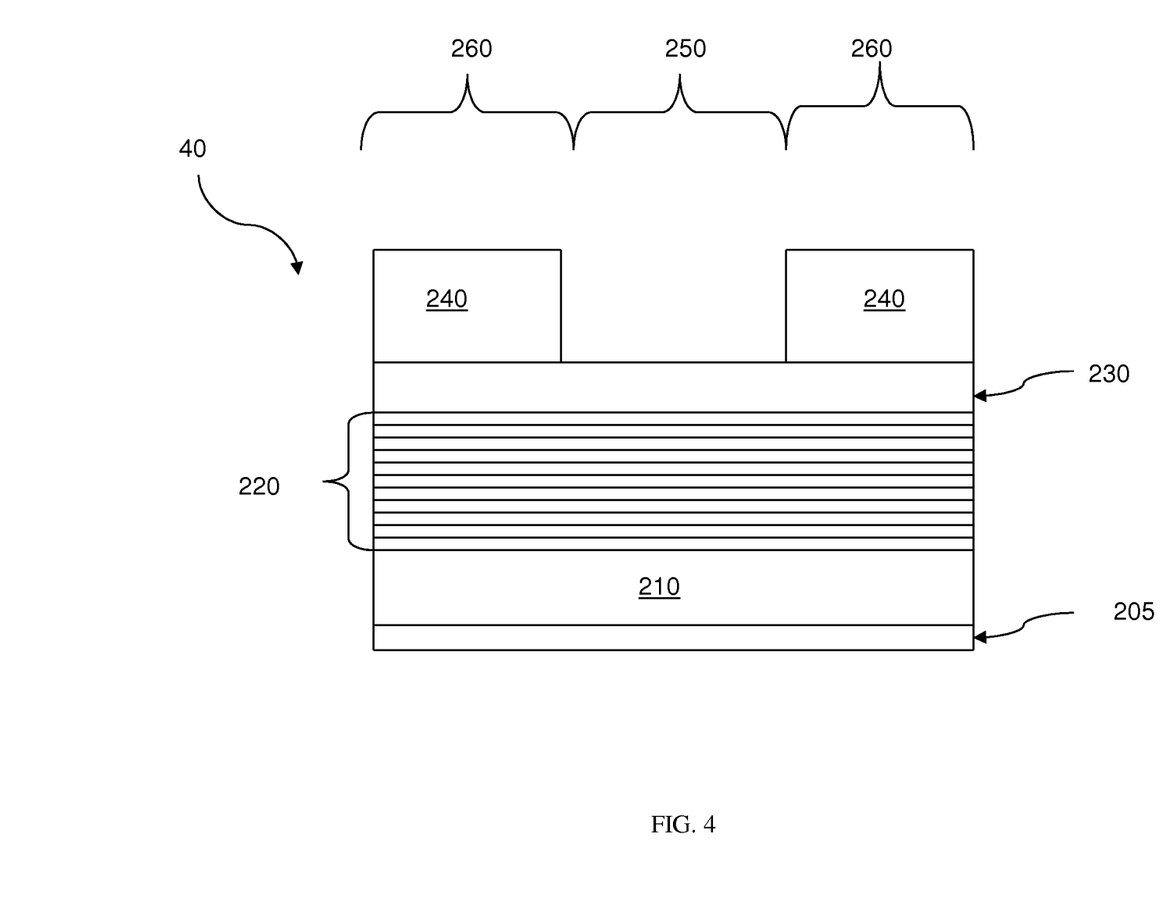

FIG. 2 is a flowchart of a method 100 of fabricating a FPhAL mask 40 according to aspects of the present disclosure. FIGS. 3 and 4 are cross-sectional views of one embodiment of the FPhAL mask 40 at various fabrication stages of the method 100.

Referring FIGS. 2 and 3, the method 100 begins at step 102 by receiving a material layer 210. The material layer 210 made of a low thermal expansion material (LTEM). The material layer 210 may include $TiO_2$, doped $SiO_2$, and/or other low thermal expansion materials known in the art. The LTEM serves to minimize image distortion due to mask heating. The LTEM layer 210 includes materials with a low defect level and a smooth surface. In addition, a conductive layer 205 is deposited under (as shown in the figure) the LTEM layer 210 for electrostatic chucking purpose. In an embodiment, the conductive layer 205 includes chromium nitride (CrN), though other compositions are possible.

The method 100 proceeds to step 104 by forming a reflective multilayer (ML) 220 over the LTEM layer 210. According to Fresnel equations, light reflection will occur when light propagates across the interface between two materials of different refractive indices. The reflected light is larger when the difference of refractive indices is larger. To increase the reflected light, one may also increase the number of interfaces by depositing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The refractive ML 220 includes a plurality of film pairs, such as molybdenum-silicon (Mo/Si) film pairs (e.g., a layer of molybdenum above or below a layer of silicon in each film pair). Alternatively, the refractive ML 220 may include molybdenum-beryllium (Mo/Be) film pairs, or any material that is highly reflective at EUV wavelengths can be utilized for the refractive ML 220. The thickness of each layer of the refractive ML 220 depends on the EUV wavelength and the incident angle. The thickness of the 1 refractive ML 220 is adjusted to achieve a maximum constructive interference of the EUV light reflected at each interface and a minimum absorption of the EUV light by the 1 refractive ML 220. The refractive ML 220 may be selected such that it provides a high reflectivity to a selected radiation type/wavelength. A typical number of film pairs is 20-80, however any number of film pairs is possible. The refractive ML 220 usually achieves a reflectance of 0.65 or above. In an embodiment, the conformal refractive ML 220 includes forty pairs of layers of Mo/Si. Each Mo/Si film pair has a thickness of about 7 nm, with a total thickness of 280 nm. In this case, a reflectivity of about 70% is achieved.

Additionally, a capping layer 230 is deposited over the refractive ML 220 to prevent oxidation of the refractive ML. In one embodiment, the capping layer 230 includes silicon with about 4-7 nm thickness.

One or more of the layers 205, 220 and 230 layers may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Referring to FIGS. 2 and 3, the method 100 proceeds to step 106 by depositing a flowable-photosensitive-absorption-layer (FPhAL) 240 on the capping layer 230. The FPhAL 240 includes a solution that contains photo-sensitive inorganic materials such as $HfO_2$ or $Al_2O_3$. The FPhAL 240 is spin coated on the capping layer 230. The spin-coating process may include multi-steps with different spin speeds in each step. For example, the spin-coating process starts with a low spin to coat the FPhAL 240 uniformly over the LTEM layer 210. Then the spin-coating process proceeds to a faster main spin step to achieve a target coating thickness of the FPhAL 240. Then the main spin step is followed by another low spin speed step or a non-spin step (referred to as a waiting step) to allow the FPhAL 240 to reflow and achieve a more conformable coating profile along the topography of the LTEM layer 210.

Referring to FIGS. 2 and 4, the method 100 proceeds to step 108 by patterning the FPhAL 240. An exposure process is performed on the FPhAL 240. The exposure process includes introducing a radiation beam to FPhAL 240. The radiation beam may be ultraviolet and/or can be extended to include other radiation beams such as e-beam, x-ray, extreme ultraviolet, deep ultraviolet, and other proper radiation beams. The radiation beam causes a chemical change in exposed regions of the FPhAL 240, which may increase or decrease solubility of the exposed regions. If the exposed regions become more soluble, the FPhAL 240 is referred to as a positive type. If the exposed regions become less soluble, the FPhAL 240 is referred to as a negative type. Baking processes may be performed before or after exposing the substrate, such as a post-exposure baking process.

A developing process selectively removes the exposed or unexposed regions with a developing solution creating an exposure pattern over the LTEM layer 210. As an example, the LTEM layer 210 may be immersed in a developer liquid for a predetermined amount of time during which a portion of the FPhAL 240 is dissolved and removed. In one embodiment, unexposed FPhAL 240 is removed by the developer. A separate, additional rinse may also be applied. The composition of the developer solution is dependent on the composition of the FPhAL 240. For example, a base solution of 2.5% tetramethylammonium hydroxide (TMAH) is used. For another example, a base solution of 25% TMAH is used. However, other suitable compositions now known or later developed are also within the scope of the disclosure. The developer may be applied by a puddling process, immersion, spray, and/or other suitable methods.

In the present embodiment, the mask 40 is formed with two regions, a first region 250 and a second region 260. In the first region 250, the FPhAL 240 is removed while it remains in the second region 260. The first region is a reflective region allowing light be reflected or transmitted from it and the second region is a dark region where most portion of light is absorbed.

Additional steps can be provided before, during, and after the method 100, and some of the steps described can be replaced, eliminated, or moved around for additional embodiments of the method 100. As an example, another capping layer may be deposited over the first and second regions after patterning the FPhAL 240.

Figure 5:
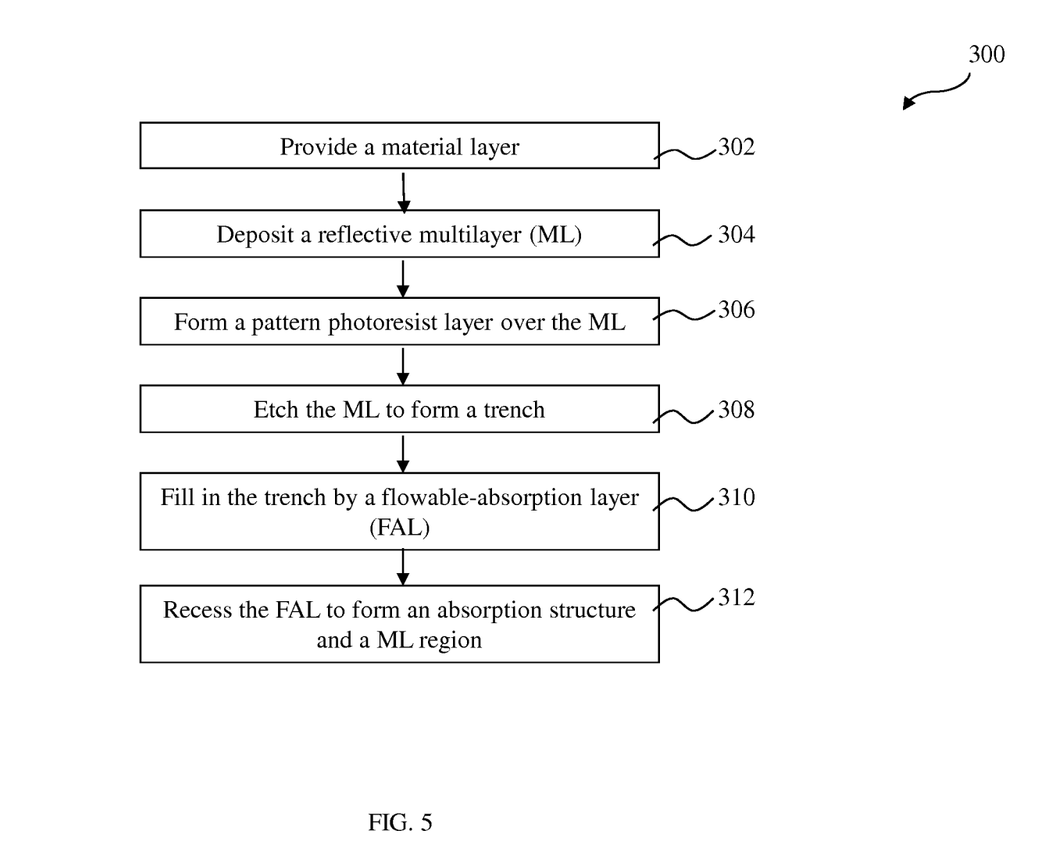
FIG. 5 is a flow chart of a method for fabricating another mask according to various aspects of the present disclosure.
Figure 6:
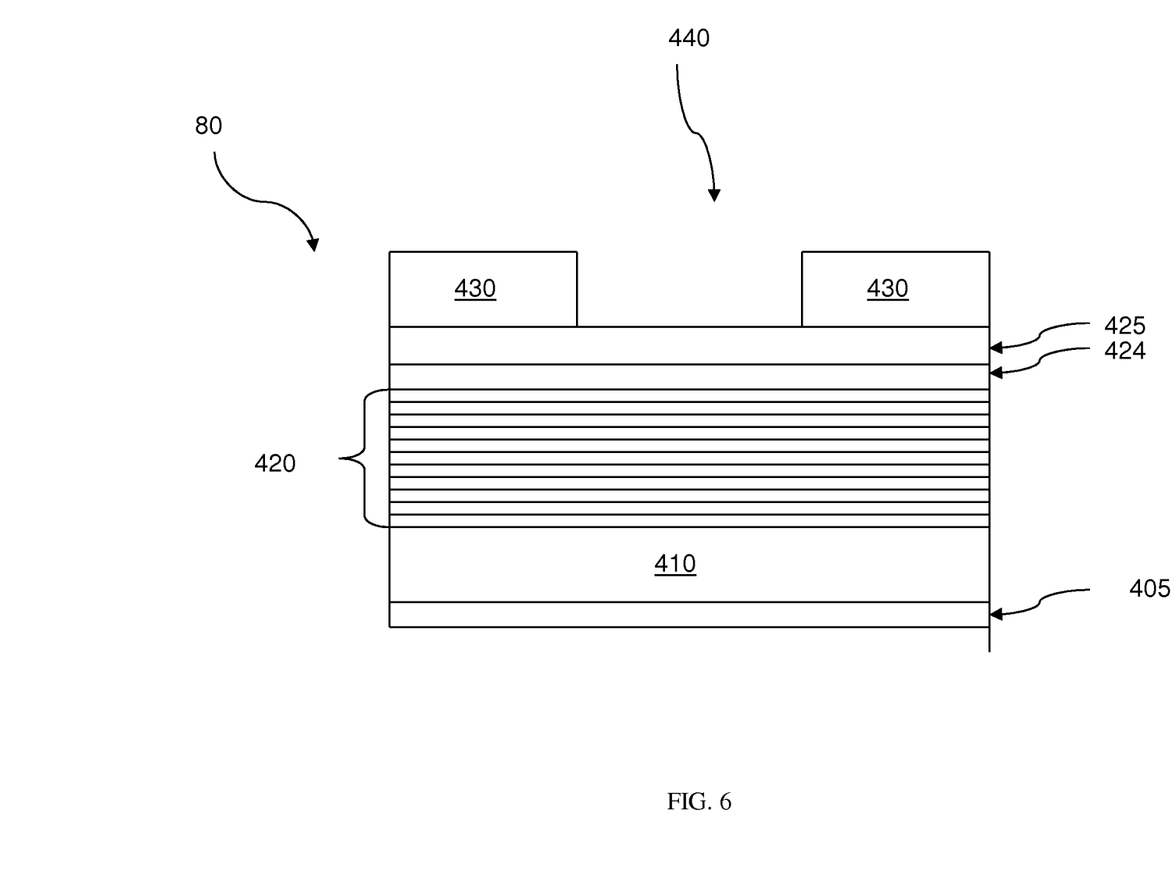
FIGS. 6 to 10 are diagrammatic cross-sectional views of a mask according to various aspects of the present disclosure.
Figure 9:
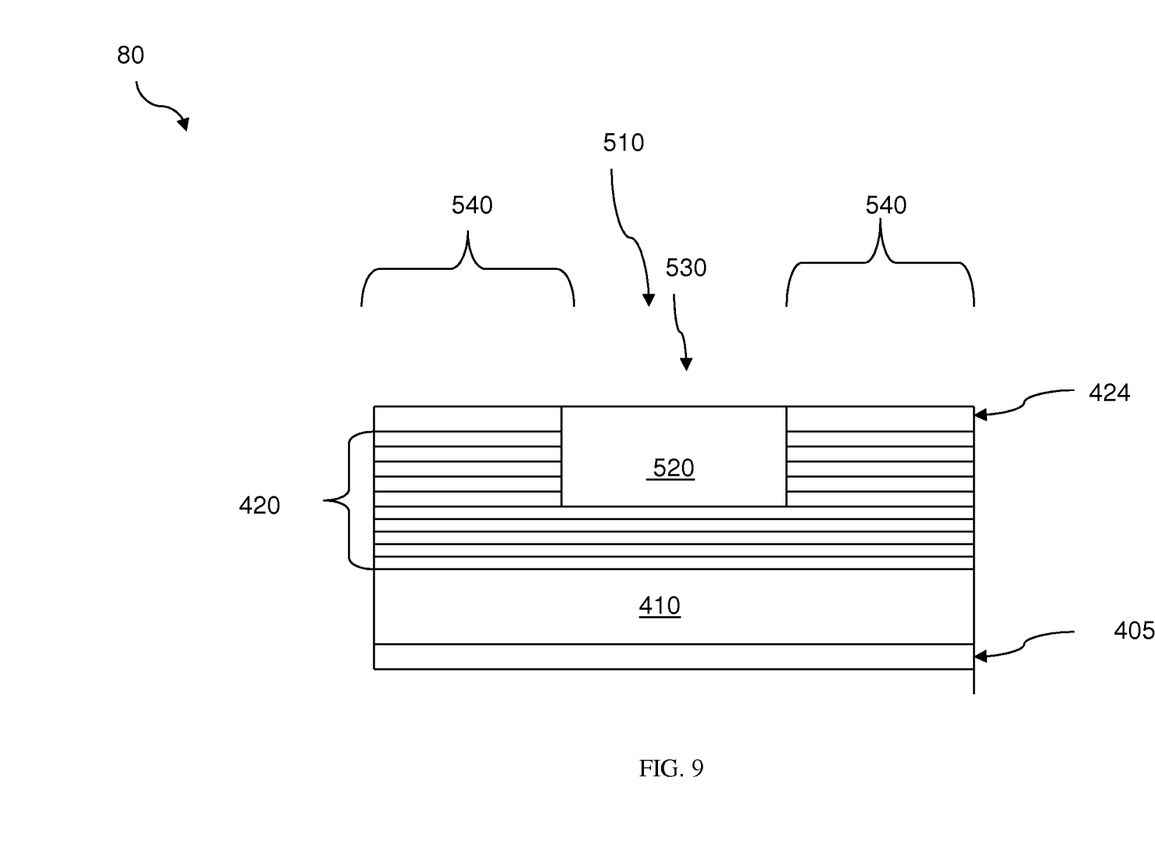

FIG. 5 is a flowchart of a method 300 of fabricating a flowable-absorption-layer (FAL) mask 80 according to aspects of another embodiment of the present disclosure. FIGS. 6 and 9 are cross-sectional views of one embodiment of the FAL mask 80 at various fabrication stages of the method 300.

Referring to FIGS. 5 and 6, the method begins at step 302 by providing the LTEM 1 layer 410. The LTEM layer 410, including a conductive layer 405 deposited under (as shown in the figure) the LTEM layer 410 is similar in many respects to the LTEM layer 210 discussed above in association with FIG. 3.

The method 300 proceeds to step 304 by depositing a reflective ML 420 on the layer 410. The reflective ML 420 is similar in many respects to the reflective ML 220 discussed above in association with FIG. 3.

The method 300 proceeds to step 306 by forming a patterned photoresist layer 430 having an opening 440. In one embodiment, before coating the photoresist 430, a hard mask layer 425 is deposited on the reflective ML 420. The hard mask layer 425 may include ruthenium (Ru), RuSi, or a combination thereof and be formed by CVD, PVD, ALD, and/or other suitable process. Additionally, a capping layer 424 is deposited on the reflective ML 420 prior to depositing the hard mask layer 425. The capping layer 424 is similar in many respects to the capping layer 230 discussed above in association with FIG. 3. The photoresist 430 is deposited by a suitable process, such as spin-on coating, and then exposed and developed to form openings 440.

Figure 7:
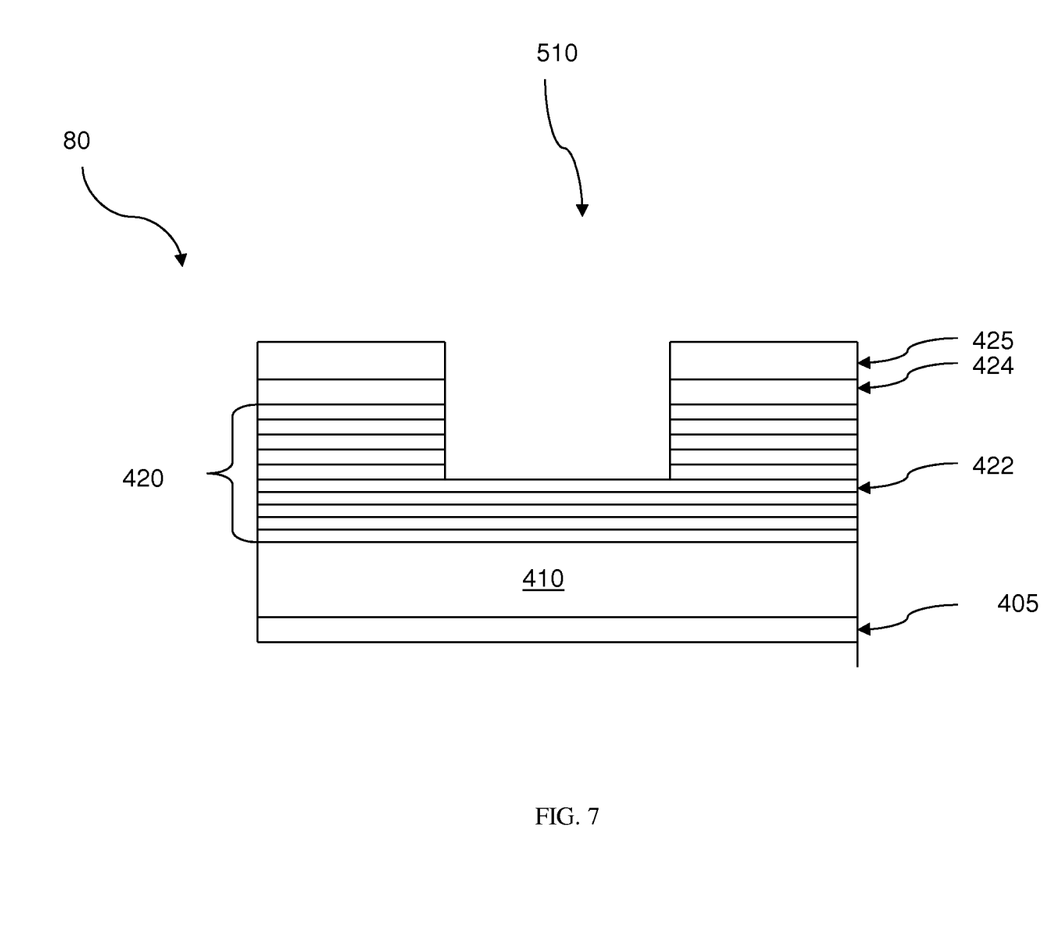

Referring to FIGS. 5 and 7, the method 300 proceeds to step 308 by etching the reflective ML 420 to form a trench 510. A first etching process is performed to etch the hard mask layer 425 through the opening 440 of the patterned photoresist layer 430. The first etching process may stop on the underlying capping layer 424. A second etching process is followed to etch a portion of the refractive ML 420 to form the trench 510. A depth of the trench 510 may be controlled by the etching process to achieve a targeted depth. In one embodiment, an etching stop layer (ESL) 422 is embedded in the reflective ML 420 and using the ESL 422 as an etching stop when forming the trench 510 by etching the reflective ML 420. The ESL 422 may include chromium, chromium oxide, and chromium nitride.

The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof.

Figure 8:
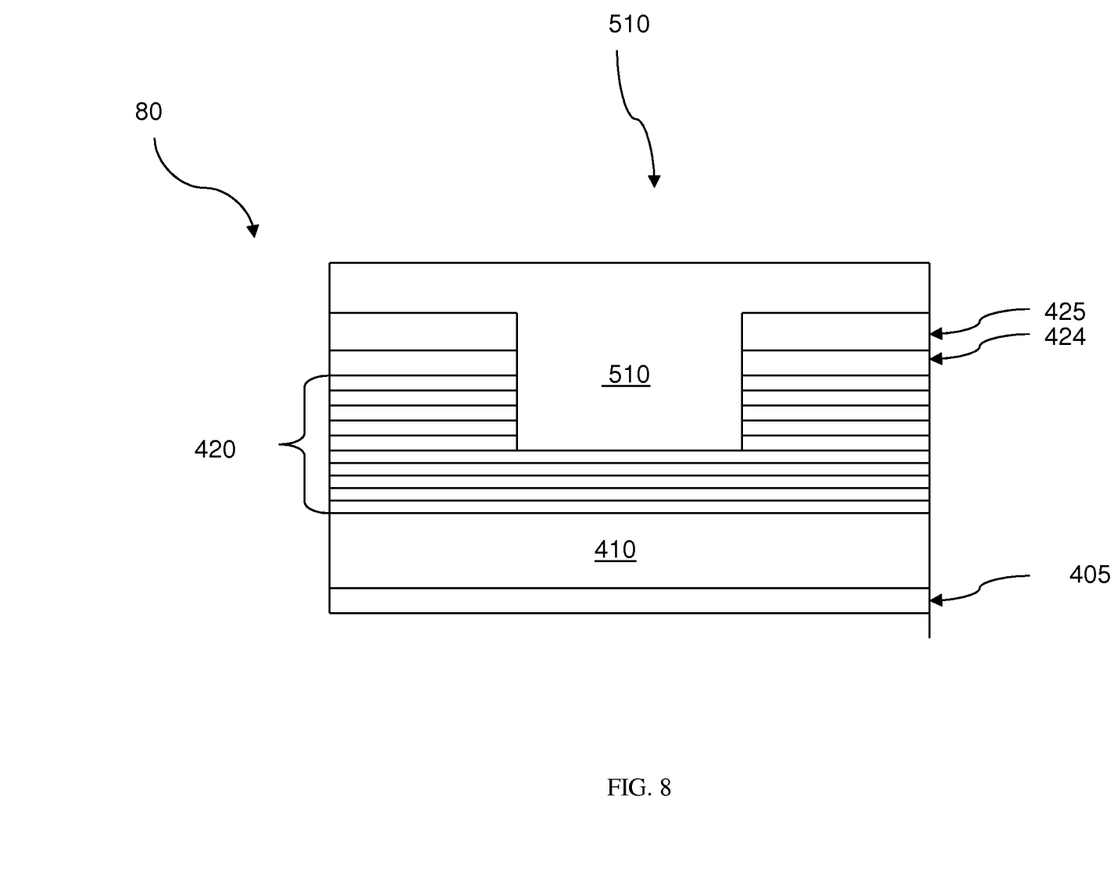

Referring to FIGS. 5 and 8, the method 300 proceeds to step 310 by filling in the trench 510 with a FAL 520. The FAL 520 may include a solution that contains HfO$_2$, or Al$_2$O$_3$. In the present embodiment, the trench 510 is filled in with the FAL 520 by a spin-coating process. In one embodiment, a thickness of the FAL 520 is controlled such that it fills up the trench 510 and continues to deposit above the trench.

Referring to FIGS. 5 and 9, the method 300 proceeds to step 312 for recessing the FAL 520 to form an absorption structure 530 in the trench 510 and remove the FAL 520 outside of the trench 510, referred to as a region 540. The recess process may include a chemical-mechanical polish (CMP) process. The portion of the FAL 520 which is above the capping layer 424 is removed to form the absorption structure 530 in the trench 510. The top surface of the absorption structure 530 is substantially coplanar with the top surface of the capping layer 424 such that the absorption structure 530 and the capping layer 424 in the region 540 constitute a planarized (even) surface of the EUV mask 80.

Figure 10:
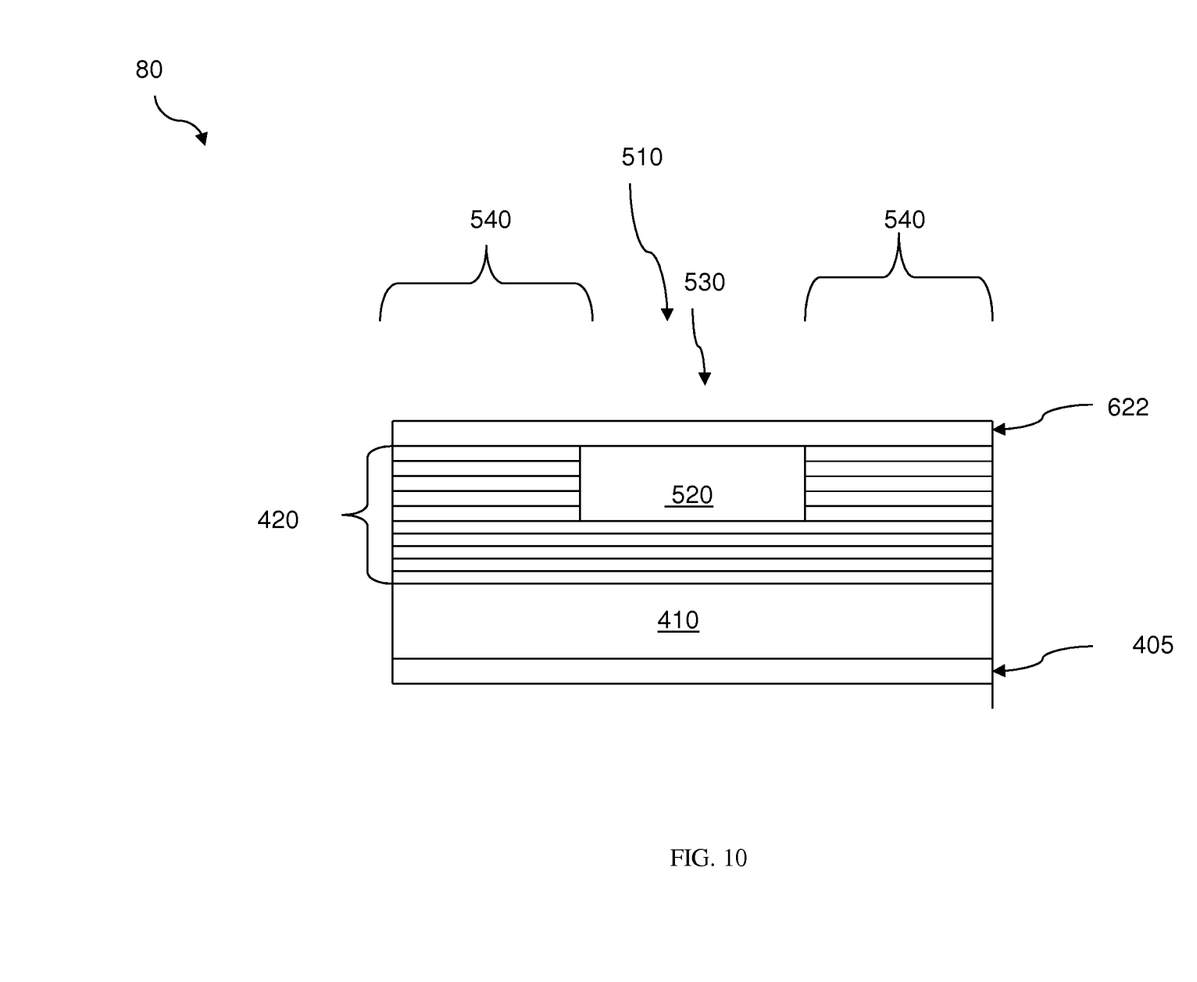

Referring to FIG. 10, alternatively, the capping layer 424 may be removed during recessing the FAL 520. Another capping layer 622 is deposited over both of the absorption structure 530 and the region 540. The capping layer 622 is similar in many respects to the capping layer 424.

Additional steps can be provided before, during, and after the method 300, and some of the steps described can be replaced, eliminated, or moved around for additional embodiments of the method 300.

Based on the above, it can be seen that the present disclosure offers a mask and fabrication the mask. The method employs forming an absorption layer by a flowable absorption layer (FAL) coated by a spin-on process. The method also employs forming a patterned absorption layer by a flowable-photo-sensitive absorption layer (FPhAL) coated by spin-on coating and patterned by lithography process. The method demonstrates reducing process induced stress, such as induced in PVD, or CVD. The method presents a quite simple and low cost process to form a patterned absorption layer.

The present disclosure provides many different embodiments of fabricating an ultraviolet (EUV) mask. In one embodiment, the method includes providing a low thermal expansion material (LTEM) layer, forming a reflective multiple-layer (ML) over the LTEM layer, forming a conductive layer over an opposite surface of the LTEM layer, spin-coating a flowable-photosensitive-absorption-layer (FPhAL) over the reflective ML and patterning the FPhAL by a lithography process to form a patterned absorption layer having a first region and a second region. The FPhAL is removed in the first region and remains in the second region In another embodiment, a method for fabricating an extreme ultraviolet (EUV) mask includes providing a low thermal expansion material (LTEM) layer, forming a reflective multiple-layer (ML) over the LTEM layer, forming a conductive layer over an opposite surface of the LTEM layer, forming a trench in the reflective ML, spin-coating a flowable absorption layer (FAL) to fill in the trench and recessing the FAL so that the FAL outside the trench is removed and an absorption structure is formed in the trench.

In yet another embodiment, A method for fabricating an extreme ultraviolet (EUV) mask includes providing a low thermal expansion material (LTEM) layer, depositing a reflective multiple-layer (ML) over the LTEM layer, forming a conductive layer over an opposite surface of the LTEM layer, depositing a capping layer over the reflective ML, spin-coating a flowable-photosensitive-absorption-layer (FPhAL) over the reflective ML, exposing the FPhAL by a radiation and developing the FPhAL by a developer to define a first region and a second region. In the first region, the exposed FPhAL remains, while in the second region, the unexposed FPhAL is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an extreme ultraviolet (EUV) mask, the method comprising:
   providing a low thermal expansion material (LTEM) layer;
   forming a reflective multiple-layer (ML) over the LTEM layer;
   forming a conductive layer over an opposite surface of the LTEM layer;
   spin-coating a flowable-photosensitive-absorption-layer (FPhAL) over the reflective ML, wherein the FPhAL contains at least one of $HfO_2$ and $Al_2O_3$; and
   patterning the FPhAL by a lithography process to form a patterned absorption layer having a first region and a second region, wherein the FPhAL is removed in the first region and remains in the second region.

2. The method of claim 1, wherein the lithography process of forming patterned FPhAL includes:
   exposing the FPhAL by a radiation; and
   developing the FPhAL in a developer to remove the unexposed FPhAL.

3. The method of claim 2, wherein the developer contains tetramethylammonium hydroxide (TMAH).

4. The method of claim 1, wherein the lithography process of forming patterned FPhAL includes:
   exposing the FPhAL by a radiation; and
   developing the FPhAL in a developer to remove the exposed FPhAL.

5. The method of claim 4, wherein the developer contains tetramethylammonium hydroxide (TMAH).

6. The method of claim 1, further comprising:
   prior to spin-coating the FPhAL, forming a capping layer over the reflective ML.

7. The method of claim 1, further comprising:
   after patterning the FPhAL, forming a capping layer over the first and second regions.

8. A method for fabricating an extreme ultraviolet (EUV) mask, the method comprising:
   providing a low thermal expansion material (LTEM) layer;
   forming a reflective multiple-layer (ML) over the LTEM layer;
   forming a conductive layer over an opposite surface of the LTEM layer;
   forming a trench in the reflective ML;
   spin-coating an absorption layer containing a photo-sensitive inorganic material to fill in the trench; and
   recessing the absorption layer so that the absorption layer outside the trench is removed and an absorption structure is formed in the trench.

9. The method of claim 8, wherein the photo-sensitive inorganic material contains at least one of $HfO_2$ and $Al_2O_3$.

10. The method of claim 8, wherein forming the trench includes:
    forming a hard mask layer over the reflective ML;
    spin-coating a photoresist;
    patterning the photoresist to form an opening;
    etching the hard mask layer through the opening; and
    etching the reflective ML through the etched hard mask layer.

11. The method of claim 8, further comprising:
    forming an etching stop layer (ESL) in the reflective ML; and
    using the ESL as an etching stop when forming the trench by etching the reflective ML.

12. The method of claim 11, wherein the ESL includes material from the group consisting of chromium, chromium oxide, and chromium nitride.

13. The method of claim 8, further comprising:
    prior to spin-coating the photoresist, forming a capping layer over the reflective ML.

14. The method of claim 8, wherein the absorption layer is recessed by chemical-mechanical polishing.

15. The method of claim 13, further comprising:
    removing the capping layer during recessing the absorption layer.

16. The method of claim 8, wherein a top surface of the absorption structure is substantially coplanar with a top surface of the region without the absorption layer.

17. The method of claim 8, further comprising:
    after recessing the the absorption layer, forming another capping layer over the regions with and without the absorption layer.

18. A method for fabricating an extreme ultraviolet (EUV) mask, the method comprising:
    providing a low thermal expansion material (LTEM) layer;
    depositing a reflective multiple-layer (ML) over the LTEM layer;
    depositing a capping layer over the reflective ML;
    spin-coating an absorption layer containing a photo-sensitive inorganic material over the reflective ML;
    exposing the absorption layer by a radiation to form an exposed absorption layer including a first region including exposed photo-sensitive inorganic material and a second region including unexposed photo-sensitive inorganic material; and
    developing the exposed absorption layer by a developer, wherein in the first region, the exposed photo-sensitive inorganic material remains, and wherein in the second region, the unexposed photo-sensitive inorganic material is removed.

19. The method of claim 18, wherein the absorption layer contains at least one of $HfO_2$ and $Al_2O_3$.

20. The method of claim 19, further comprising:
    after the developing the absorption layer, forming a second capping layer over the first and second regions.

* * * * *